United States Patent
Kim et al.

(10) Patent No.: US 9,595,434 B2
(45) Date of Patent: Mar. 14, 2017

(54) APPARATUS AND METHODS FOR MANUFACTURING SEMICONDUCTOR DEVICES AND TREATING SUBSTRATES

(71) Applicant: Samsung Electronics Co., Ltd., Suwon-si (KR)

(72) Inventors: Kyoungseob Kim, Suwon-si (KR); Yongsun Ko, Suwon-si (KR); Kyoung Hwan Kim, Yongin-si (KR); SeokHoon Kim, Seongnam-si (KR); Kuntack Lee, Suwon-si (KR); Hyosan Lee, Hwaseong-si (KR)

(73) Assignee: SAMSUNG ELECTRONICS CO., LTD., Samsung-ro, Yeongtong-gu, Suwon-si, Gyeonggi-do (KR)

( * ) Notice: Subject to any disclaimer, the term of this patent is extended or adjusted under 35 U.S.C. 154(b) by 0 days.

(21) Appl. No.: 14/704,912

(22) Filed: May 5, 2015

(65) Prior Publication Data

US 2016/0027637 A1 Jan. 28, 2016

(30) Foreign Application Priority Data

Jul. 25, 2014 (KR) ........................ 10-2014-0094987

(51) Int. Cl.
*H01L 21/00* (2006.01)
*H01L 21/02* (2006.01)
*H01L 21/78* (2006.01)
*H01L 21/67* (2006.01)

(52) U.S. Cl.
CPC .. *H01L 21/02068* (2013.01); *H01L 21/67051* (2013.01); *H01L 21/78* (2013.01)

(58) Field of Classification Search
CPC .......... H01L 21/67051; H01L 21/6704; H01L 21/67023; H01L 21/67028; H01L 21/02052
See application file for complete search history.

(56) References Cited

U.S. PATENT DOCUMENTS 5,975,098 A * 11/1999 Yoshitani .................. B08B 3/02
134/148
8,511,583 B2 8/2013 Liu et al.
8,523,332 B2 9/2013 Drury et al.
(Continued)

FOREIGN PATENT DOCUMENTS

JP 2002-011419 A 1/2002
JP 2003234321 A * 8/2003
(Continued)

*Primary Examiner* — Zandra Smith
*Assistant Examiner* — Evan Clinton
(74) *Attorney, Agent, or Firm* — Muir Patent Law, PLLC

(57) ABSTRACT

A method of manufacturing a semiconductor device includes: forming a pattern on a surface of a semiconductor substrate; placing the substrate on a platform of a substrate treatment apparatus; rotating the wafer while applying a cleaning liquid from a first nozzle and a wetting liquid from a second nozzle to treat a first region on the surface of the substrate; vertically changing the distance of the second nozzle together with the first nozzle with respect to the platform; after the vertical change, rotating the wafer while applying the cleaning liquid from the first nozzle and the wetting liquid from the second nozzle to treat a second region on the surface of the substrate; and forming a semiconductor device from the treated substrate.

18 Claims, 12 Drawing Sheets

(56) References Cited

U.S. PATENT DOCUMENTS

| | | |
|---|---|---|
| 8,651,625 B2 | 2/2014 | Karlinski |
| 8,727,475 B2 | 5/2014 | Bibl et al. |
| 2002/0026931 A1* | 3/2002 | Kurosawa ............ B28D 5/0094 125/35 |
| 2009/0085138 A1* | 4/2009 | Ryu ........................ H01L 25/50 257/434 |
| 2011/0031326 A1 | 2/2011 | Sato |
| 2011/0262650 A1 | 10/2011 | Lee |
| 2012/0222707 A1* | 9/2012 | Sato .................. H01L 21/67051 134/33 |
| 2012/0247506 A1 | 10/2012 | Tanaka et al. |

FOREIGN PATENT DOCUMENTS

| | | |
|---|---|---|
| JP | 2012-216777 A | 11/2012 |
| JP | 2013-077597 A | 4/2013 |
| KR | 10-0471750 B1 | 3/2005 |
| KR | 10-1319744 B1 | 10/2013 |

\* cited by examiner

APPARATUS AND METHODS FOR MANUFACTURING SEMICONDUCTOR DEVICES AND TREATING SUBSTRATES

CROSS-REFERENCE TO RELATED APPLICATIONS

This U.S. nonprovisional patent application claims priority under 35 U.S.C. §119 to Korean Patent Application 10-2014-0094987 filed on Jul. 25, 2014, the entire contents of which are hereby incorporated by reference.

BACKGROUND

The present disclosure relates to an apparatus and methods for manufacturing semiconductor devices and treating substrates and, more particularly, to an apparatus and methods for treating substrates in order to prevent damage to the substrate.

In production processes for semiconductor devices and liquid crystal display devices, semiconductor wafers and glass substrates are treated with a treatment liquid. A substrate treatment apparatus of a single substrate treatment type adapted to treat a single substrate generally includes a droplet nozzle to provide droplets of the treatment liquid onto a surface of the substrate held by a spin chuck. In the substrate treatment apparatus, the substrate is cleaned by causing the droplets to impinge the surface of the substrate.

SUMMARY

Embodiments of the inventive concept provide an apparatus and methods for treating substrates and manufacturing semiconductor devices in which a side nozzle injecting a wetting liquid vertically moves together with a droplet nozzle injecting droplets.

Embodiments of the inventive concept provide an apparatus and methods for treating substrates and manufacturing semiconductor devices in which a wetting layer has a thickness of which value is changeable.

According to an exemplary embodiment, a method of manufacturing a semiconductor device includes: forming a pattern on a surface of a semiconductor substrate; placing the substrate on a platform of a substrate treatment apparatus; rotating the substrate while applying a cleaning liquid from a first nozzle and a wetting liquid from a second nozzle to treat a first region on the surface of the substrate; vertically changing the distance of the second nozzle together with the first nozzle with respect to the platform; after the vertical change, rotating the wafer while applying the cleaning liquid from the first nozzle and the wetting liquid from the second nozzle to treat a second region on the surface of the substrate; and forming a semiconductor device from the treated substrate.

In one embodiment, vertically changing the distance is performed by vertically moving a nozzle arm connected to the first and second nozzles.

In one embodiment, the method further includes: for the first region, applying a relatively thicker amount of wetting liquid to the surface of the substrate, and then applying the cleaning liquid to the relatively thicker amount of wetting liquid; and for the second region, applying a relatively thinner amount of wetting liquid to the surface of the substrate, and then applying the cleaning liquid to the relatively thinner amount of wetting liquid.

In one embodiment, applying the cleaning liquid from the first nozzle includes spraying the cleaning liquid toward the surface of the substrate at an angle with respect to the substrate of about 90 degrees, and applying the wetting liquid from the second nozzle includes spraying the wetting liquid toward the surface of the substrate at an angle with respect to the substrate of less than 90 degrees.

In one embodiment, as a result of the rotating, the wetting liquid applied to the substrate is applied upstream from the cleaning liquid applied to the substrate.

In one embodiment, treating the second region includes: moving a nozzle arm horizontally with respect to the substrate to move at least the first nozzle in a radial direction with respect to the substrate.

In one embodiment, the method further includes: applying the cleaning liquid at a flow quantity of less than about 1/10 the flow quantity of applying the wetting liquid.

In one embodiment, the wetting liquid is applied by providing the wetting liquid at a flow quantity of about 0.5 l/min to about 2 l/min; and the cleaning liquid is applied by providing the cleaning liquid at a flow quantity of about 20 cc/min to about 50 cc/min.

In one embodiment, the substrate is a wafer, and the method further includes: forming the semiconductor device by singulating a piece of the wafer to form a semiconductor chip.

In one embodiment, the method further includes: forming the semiconductor device by placing the semiconductor chip on a package substrate and covering the semiconductor chip by a protective mold to form a semiconductor package.

According to another embodiment, a method of manufacturing a semiconductor device includes; forming a pattern on a surface of a semiconductor substrate; placing the substrate on a platform of a substrate treatment apparatus; rotating the substrate while applying a cleaning liquid from a first nozzle and a wetting liquid from a second nozzle to treat a first region on the surface of the substrate; vertically moving second nozzle with respect to the platform; after the vertical movement, rotating the wafer while applying the cleaning liquid from the first nozzle and the wetting liquid from the second nozzle to treat a second region on the surface of the substrate; and forming a semiconductor device from the treated substrate.

In one embodiment, the method further includes: for the first region, applying a relatively thicker amount of wetting liquid to the surface of the substrate, and then applying the cleaning liquid on the relatively thicker amount of wetting liquid; and for the second region, after vertically moving the second nozzle, applying a relatively thinner amount of wetting liquid to the surface of the substrate, and then applying the cleaning liquid on the relatively thinner amount of wetting liquid.

In one embodiment, a pressure applied by the cleaning liquid is greater when the cleaning liquid is applied on the relatively thinner amount of wetting liquid than when the cleaning liquid is applied on the relatively thicker amount of wetting liquid.

In one embodiment, the step of vertically moving the second nozzle includes vertically moving the second nozzle together with the first nozzle with respect to the platform.

In one embodiment, applying the cleaning liquid from the first nozzle includes spraying the cleaning liquid toward the surface of the substrate at an angle with respect to the substrate of about 90 degrees, and applying the wetting liquid from the second nozzle includes spraying the wetting liquid toward the surface of the substrate at an angle with respect to the substrate of less than 90 degrees.

In one embodiment, as a result of the rotating, the wetting liquid applied to the substrate is applied upstream from the cleaning liquid applied to the substrate.

In one embodiment, treating the second region includes: moving a nozzle arm horizontally with respect to the substrate to move at least the first nozzle in a radial direction with respect to the substrate.

In one embodiment, the method further includes applying the cleaning liquid at a flow quantity of less than about $\frac{1}{10}$ the flow quantity of applying the wetting liquid.

According to another exemplary, a method includes: placing a substrate on a platform of a substrate treatment apparatus; providing a wetting liquid on the substrate using a side nozzle so as to form a wetting layer on the substrate; treating the substrate by providing droplets of a treatment liquid on the substrate using a droplet nozzle so as to give the wetting layer a pressure generating from collisions between the droplets and a surface of the wetting layer. The forming of the wetting layer may comprise: vertically moving the side nozzle together with the droplet nozzle on the substrate; and providing the wetting liquid on the substrate using the side nozzle. The wetting layer may have a thickness of which value is varied depending on the vertical movement of the side nozzle. The pressure may have a value changeable depending on a variation of the thickness of the wetting layer.

In some embodiments, the forming of the wetting layer may comprise at least one of: moving the side nozzle together with the droplet nozzle toward a surface of the substrate to form a first wetting layer having a first thickness on the surface of the substrate; and moving the side nozzle together with the droplet nozzle away from the surface of the substrate to form a second wetting layer on the surface of the substrate. The second thickness may be less than the first thickness thereon.

In some embodiments, the providing of the droplets may comprise at least one of: colliding the droplets with a surface of the first wetting layer to provide the first wetting layer with a first pressure; and colliding the droplets with a surface of the second wetting layer to provide the second wetting layer with a second pressure greater than the first pressure.

In some embodiments, the forming of the wetting layer may further comprise: rotating the substrate around a central axis thereof; horizontally moving the droplet nozzle on a surface of the substrate along a half-scan locus extending between an edge and a center of the substrate; and horizontally moving the side nozzle together with the droplet nozzle on the surface of the substrate along the half-scan locus.

In some embodiments, the forming of the wetting layer may further comprise: rotating the substrate around a central axis thereof; horizontally moving the droplet nozzle on a surface of the substrate along a full-scan locus extending between opposing edges of the substrate and passing through a center of the substrate; and horizontally moving the side nozzle together with the droplet nozzle on the surface of the substrate along the full-scan locus.

In some embodiments, the forming of the wetting layer may further comprise rotating the substrate around a central axis thereof. The side nozzle may provide the wetting liquid on the surface of the substrate. The wetting liquid may be injected to an upstream side of a rotational direction of the substrate. The droplet nozzle may provide the droplets on the wetting liquid. The droplets may be injected to a downstream side of the rotational direction of the substrate.

BRIEF DESCRIPTION OF THE DRAWINGS

The foregoing and other features and advantages of exemplary embodiments of the inventive concepts will be apparent from the more particular description of non-limiting embodiments, as illustrated in the accompanying drawings in which like reference characters refer to the same or similar parts throughout the different views. The drawings are not necessarily to scale, emphasis instead being placed upon illustrating the principles of the inventive concepts. In the drawings.

DETAILED DESCRIPTION

Figure 1A:
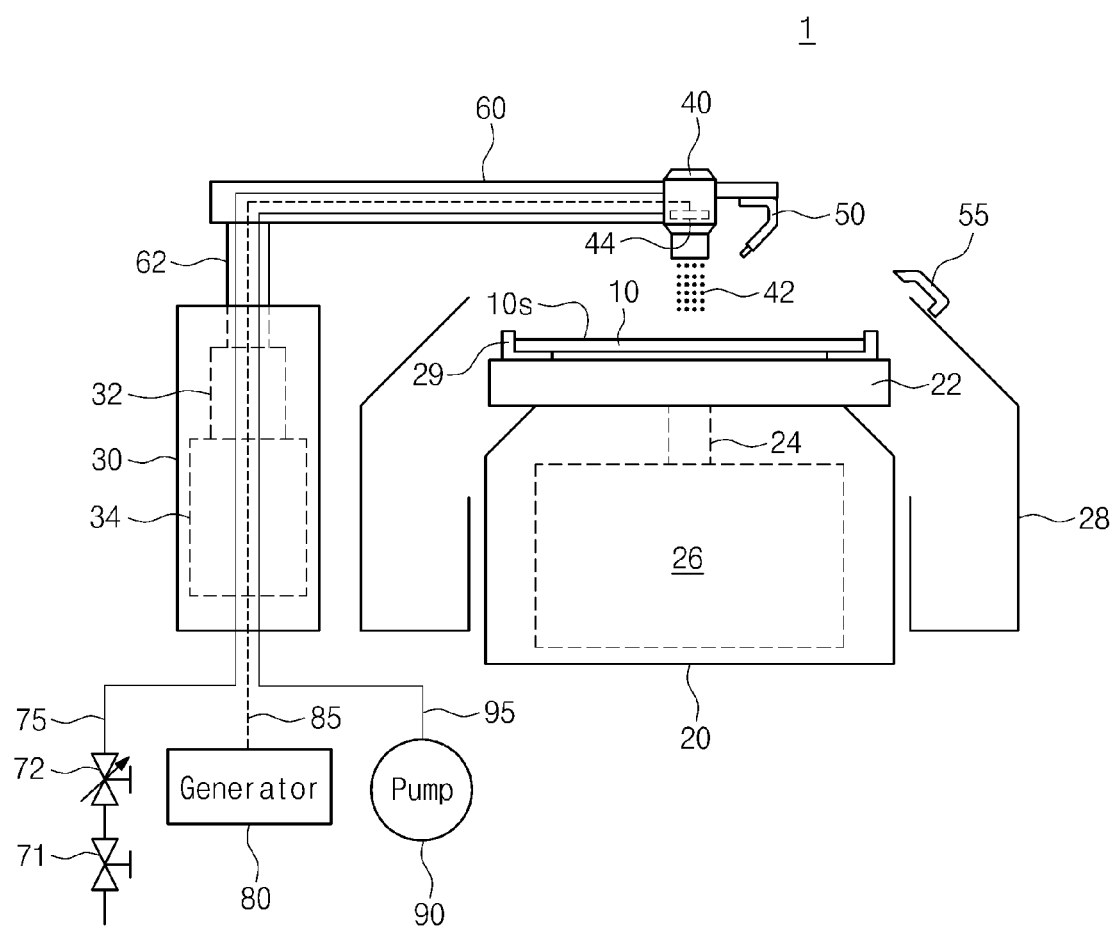
FIG. 1A is a schematic view illustrating a substrate treatment apparatus according to an exemplary embodiment of the present inventive concept.

Example embodiments of inventive concepts will now be described more fully hereinafter with reference to the accompanying drawings, in which some example embodiments are shown. Example embodiments, may, however, be embodied in many different forms and should not be construed as being limited to the embodiments set forth herein. In the drawings, the thicknesses of layers and regions are exaggerated for clarity. Like reference numerals in the drawings denote like elements. Hereinafter, exemplary embodiments will be described in conjunction with the accompanying drawings.

The terminology used herein is for the purpose of describing particular embodiments only and is not intended to be limiting of the invention. As used herein, the singular forms "a", "an" and "the" are intended to include the plural forms as well, unless the context clearly indicates otherwise. As used herein, the term "and/or" includes any and all combinations of one or more of the associated listed items and may be abbreviated as "/".

It will be understood that, although the terms first, second, etc. may be used herein to describe various elements, these elements should not be limited by these terms. Unless indicated otherwise, these terms are only used to distinguish one element from another, for example as a naming convention. For example, a first device could be termed a second device, and, similarly, a second device could be termed a first device without departing from the teachings of the disclosure.

It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

It will be understood that when an element is referred to as being "connected" or "coupled" to or "on" another element, it can be directly connected or coupled to or on the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.). However, the term "contact," as used herein refers to direct contact (i.e., touching) unless the context indicates otherwise.

Embodiments described herein will be described referring to plan views and/or cross-sectional views by way of ideal schematic views. Accordingly, the exemplary views may be modified depending on manufacturing technologies and/or tolerances. Therefore, the disclosed embodiments are not limited to those shown in the views, but include modifications in configuration formed on the basis of manufacturing processes. Therefore, regions exemplified in figures may have schematic properties, and shapes of regions shown in figures may exemplify specific shapes of regions of elements to which aspects of the invention are not limited.

Spatially relative terms, such as "beneath," "below," "lower," "above," "upper" and the like, may be used herein for ease of description to describe one element's or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device may be otherwise oriented (rotated 90 degrees or at other orientations) and the spatially relative descriptors used herein interpreted accordingly.

Terms such as "same," "planar," or "coplanar," as used herein when referring to orientation, layout, location, shapes, sizes, amounts, or other measures do not necessarily mean an exactly identical orientation, layout, location, shape, size, amount, or other measure, but are intended to encompass nearly identical orientation, layout, location, shapes, sizes, amounts, or other measures within acceptable variations that may occur, for example, due to manufacturing processes. The term "substantially" may be used herein to reflect this meaning.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and/or the present application, and will not be interpreted in an idealized or overly formal sense unless expressly so defined herein.

FIG. 1A is a schematic view illustrating a substrate treatment apparatus according to an exemplary embodiment of the present inventive concept.

Referring to FIG. 1A, a substrate treatment apparatus 1 may be a substrate cleaning apparatus of a single-wafer treatment type that cleans a substrate 10, such as a semiconductor wafer or glass substrate, one by one. The substrate treatment apparatus 1 may remove particles from a surface 10s of the substrate 10 by pressure applied thereto generating from droplets 42 of a cleaning liquid provided on the substrate 10. The substrate may include, for example, a plurality of semiconductor devices, such as semiconductor chips formed of integrated circuits on the wafer.

The substrate treatment apparatus 1 may include a spin unit 20 that horizontally holds and rotates the substrate 10, a bowl 28 that surrounds the spin unit 20, a droplet nozzle 40 that provides the droplets 42 of the cleaning liquid, a nozzle arm 60 that moves the droplet nozzle 40 on the substrate 10, a side nozzle 50 that provides a wetting liquid on the substrate 10, and a rinse nozzle 55 that provides a rinsing liquid on the substrate 10.

The substrate treatment apparatus 1 may further include a pump 90 that provides the droplet nozzle 40 with the cleaning liquid after pressurizing the cleaning liquid, a driving unit 30 that moves the nozzle arm 60, a generator 80 that creates the droplets 42 after applying frequency to the cleaning liquid, a valve 71 that controls the flow of the wetting liquid into the side nozzle 50, and a valve 72 that adjusts the flow quantity of the wetting liquid.

The spin unit 20 may include a spin chuck 22 on which the substrate 10 is horizontally held, a spin motor 26 that rotates the spin chuck 22, and a rotating axis 24 that is connected to a center of the spin chuck 22 to convey the driving force of the motor 26 to the spin chuck 22. The substrate 10 may rotate around a central axis of the spin chuck 22. The spin chuck 22 may be, for example, a clamp chuck having at least one clamp 29 adapted to grip the substrate 10. Alternatively, the spin chuck 22 may be a vacuum chuck that holds the substrate 10 by suction of the substrate 10. In certain embodiments, the spin motor 26 may rotate the substrate 10 at a rotational speed of about 300 rpm.

The bowl 28 may receive treatment liquids such as a cleaning liquid, a wetting liquid, or a rinsing liquid scattered by a centrifugal force from the substrate 10 which is rotating on the spin chuck 22. The treatment liquids received in the bowl 28 may be drained from the substrate treatment apparatus 1. In certain embodiments, the bowl 28 may be shaped like a cup or cylinder having a diameter greater than that of the substrate 10 and a slanted top portion extending upwardly toward the substrate 10.

The cleaning liquid may be pressurized by the pump 90 and provided into the droplet nozzle 40 through a cleaning liquid supplying line 95. The cleaning liquid provided into the droplet nozzle 40 may be changed into the droplets 42, for example, by a piezoelectric device 44 which is electrically connected to the generator 80 through an electrical line 85. The droplet nozzle 40 may inject the droplets 42 onto the surface 10s of the substrate 10. The wetting liquid may be provided to the side nozzle 50 through a wetting liquid supplying line 75. The side nozzle 50 may spray the wetting liquid on the surface 10s of the substrate 10. Exemplary provisions of the liquids will be described later in detail with reference to FIG. 1B.

The nozzle arm 60 may be arranged to move the droplet nozzle 40 over the substrate 10. The nozzle arm 60 may be connected to a driving unit 30, also referred to as a nozzle arm driver, including a rotating mechanism 32 such as a step motor that horizontally pivots the nozzle arm 60 and a lifting mechanism 34 such as a cylinder that vertically moves the nozzle arm 60 on the substrate 10. The horizontal and vertical movements of the nozzle arm 60 may horizontally and vertically move the droplet nozzle 40 with respect to the substrate 10. The nozzle arm 60 may be connected to the driving unit 30, for example, through a pivot axis 62. The electrical line 85, the cleaning liquid supplying line 95, and the wetting liquid supplying line 75 may be equipped in the nozzle arm 60.

The rinse nozzle 55 may provide the rinsing liquid to the surface 10s of the substrate 10. For example, the rinsing liquid may include at least one of de-ionized water (DIW), carbonated water, electrolytically ionized water, hydrogen water, ozone water, and diluted hydrochloric acid aqueous solution. In certain embodiments, the rinsing liquid may be provided onto the surface 10s of the substrate 10 before and/or after the substrate cleaning treatment. In one embodiment, the rinse nozzle 55 may be fixedly installed outside the bowl 28.

Figure 1B:
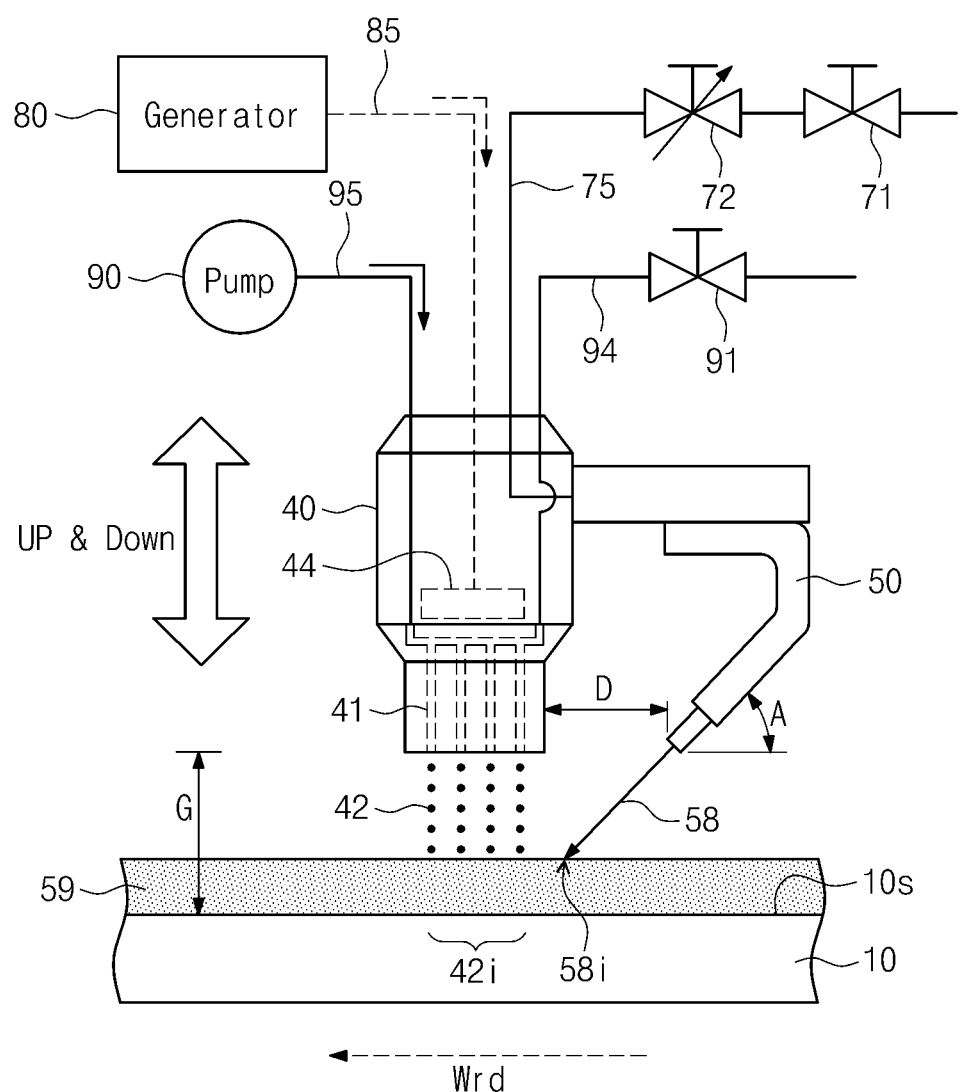
FIG. 1B is a schematic view illustrating a portion of FIG. 1A according to an exemplary embodiment.
Figure 1C:
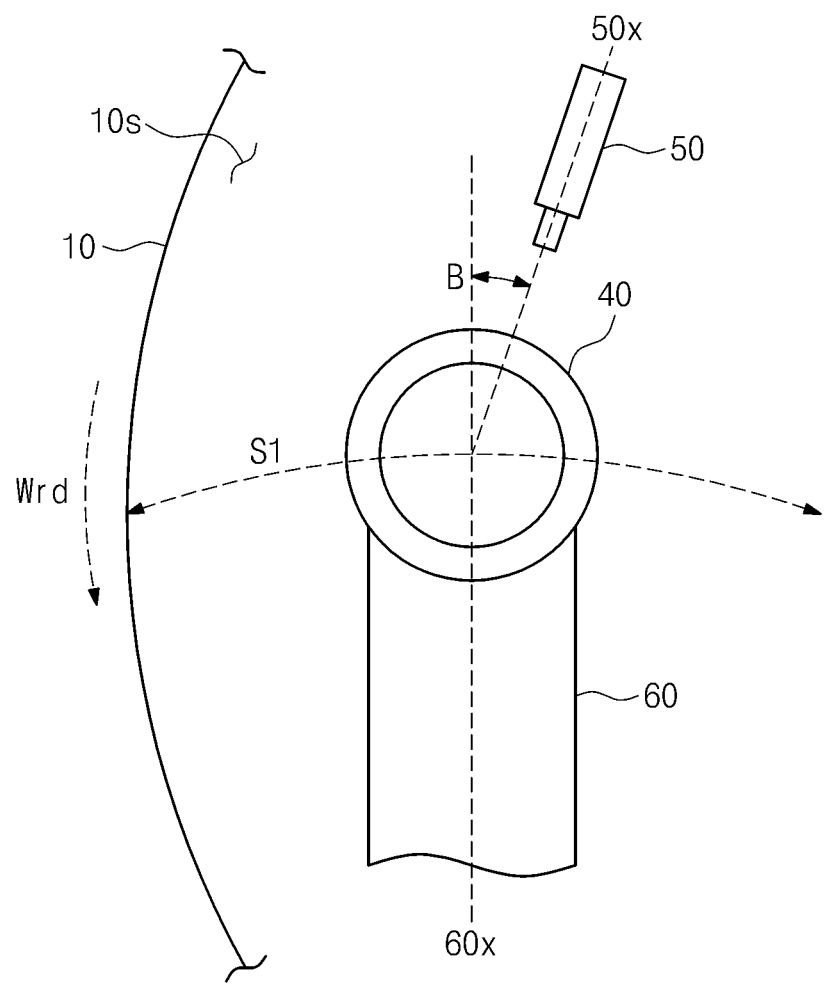
FIG. 1C is a plan view illustrating a portion of FIG. 1B according to an exemplary embodiment.

FIG. 1B is a schematic view illustrating a portion of FIG. 1A, according to an exemplary embodiment. FIG. 1C is a plan view illustrating a portion of FIG. 1B, according to an exemplary embodiment.

Figure 2A:
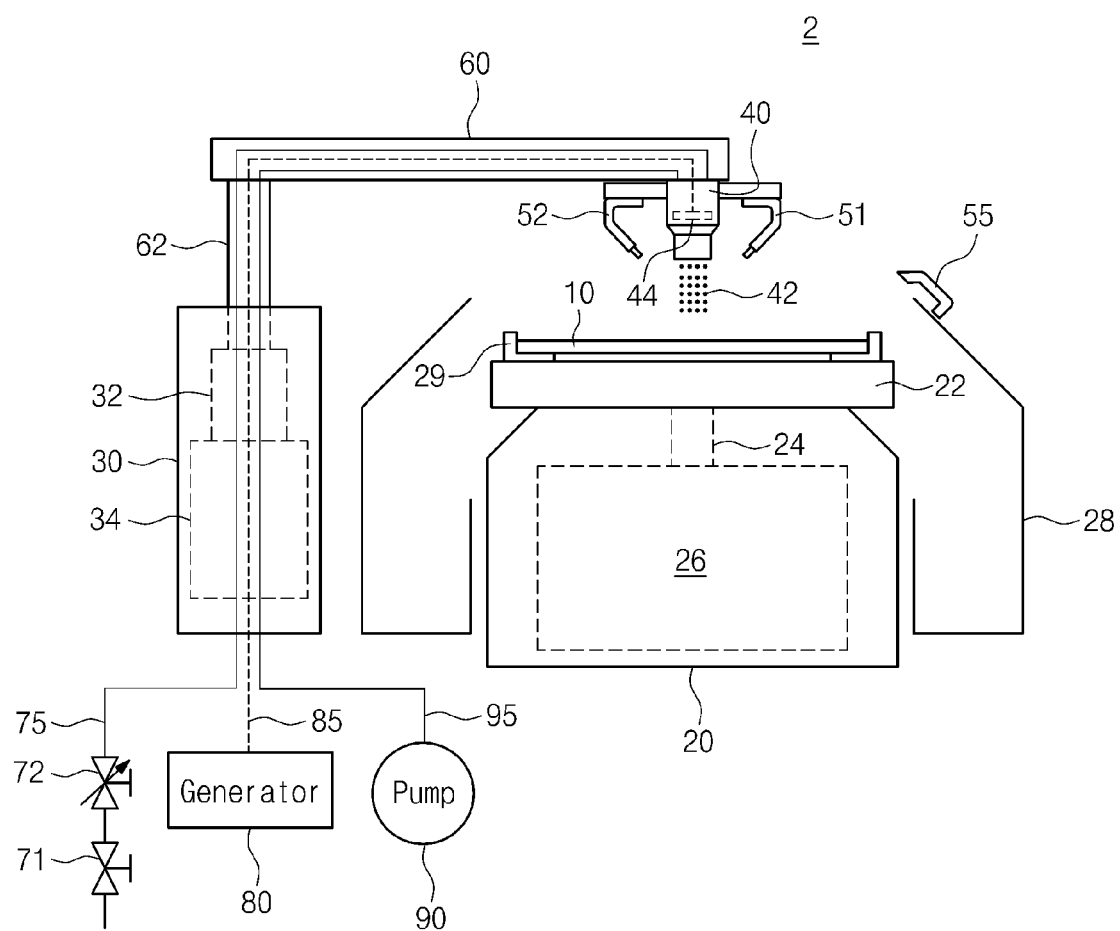
FIG. 2A is a schematic view illustrating a substrate treatment apparatus according to an exemplary embodiment of the present inventive concept.

Referring to FIGS. 1A and 1B, the droplet nozzle 40 may be an inkjet nozzle. The droplet nozzle 40 may be installed on a lateral end of the nozzle arm 60. Alternatively, the droplet nozzle 40 may be settled on a bottom end of the nozzle arm 60 as illustrated in FIG. 2A. The droplet nozzle 40 may include the piezoelectric device 44 provided therein. The piezoelectric device 44 may be electrically connected to the generator 80 through the electrical line 85 such that an AC voltage (designated by a dotted arrow) may be applied to the piezoelectric device 44 from the generator 80.

The cleaning liquid (designated by a solid arrow) may be pressurized by the pump 90 and provided into the droplet nozzle 40 through the cleaning liquid supplying line 95. The cleaning liquid provided into the droplet nozzle 40 may be changed into the droplets 42 by the piezoelectric device 44 which is vibrating at a frequency corresponding to a frequency of the AC voltage supplied from the generator 80, and the droplets 42 may pass through at least one jetting hole 41 to be sprayed onto the surface 10s of the substrate 10. The droplets 42 may be vertically sprayed toward the surface 10s of the substrate 10.

The cleaning liquid may include at least one of, for example, electrolytic ionized water, de-ionized water (DIW), carbonated water, SC1 (NH4OH+H2O2+DIW), alkaline-based chemical, acid-based chemical, and organic-based chemical. The cleaning liquid may be drained from the droplet nozzle 40 through a drain line 94 equipped with a drain valve 91.

In certain embodiments, each of the droplets 42 may be shaped like a sphere having a diameter of about 6 μm to about 15 μm. The droplets 42 may be provided onto the surface 10s of the substrate 10, for example, at a flow quantity of about 20 cc/min to about 50 cc/min and a flow rate (or jetting velocity) of about 20 m/s to about 60 m/s. The pump 90 may supply the droplet nozzle 40 with the cleaning liquid at a pressure of about 10 MPa or less.

The lift mechanism 34 may vertically move the droplet nozzle 40 to change a gap G between the droplet nozzle 40 and the surface 10s of the substrate 10. For example, the droplet nozzle 40 may move upward or downward such that the gap G may be varied in a range of about 3 mm to about 10 mm.

The side nozzle 50 may be provided at a side of the droplet nozzle 40 to obliquely inject the wetting liquid 58 onto the surface 10s of the substrate 10, which may form a wetting layer 59 on the surface 10s of the substrate 10. The wetting liquid 58 may include at least one of the cleaning liquid described above, hydrogen water, ozone water, diluted hydrochloric acid aqueous solution, isopropyl alcohol (IPA), alkaline-based chemical, acid-based chemical, and organic-based chemical. The wetting liquid 58 may be provided onto the surface 10s of the substrate 10 together with the cleaning liquid.

In a state that the valve 71 is open, the wetting liquid 58 may flow through the wetting liquid supplying line 75 to provide onto the substrate 10 from the side nozzle 50. The flow quantity and flow rate of the wetting liquid 58 may be adjusted by the valve 72. For example, the wetting liquid 58 may be provided at a flow quantity of about 0.5 l/min to about 2 l/min (e.g., in one embodiment, more than about ten times the flow quantity of the cleaning liquid).

In one embodiment, the side nozzle 50 may be arranged to vertically move together with the droplet nozzle 40 and inject the wetting liquid 58 onto an injection point 58i which is positioned at an upstream side of an injection region 42i on which the droplets 42 are provided. For example, with regard to a rotational direction Wrd of the substrate 10, the injection point 58i may be positioned at an upstream side and the injection region 42i may be placed at a downstream side, so that when liquids from the different nozzles are deposited at the same time, the wetting liquid 58 is deposited first, and then the cleaning droplets are sprayed at the wetting liquid in order to cause particle removal from the surface of the substrate 10 below the wetting liquid. A more detailed description of this particle removal is described below in connection with FIGS. 1G and 1H. As illustrated in FIG. 1C, for example, the side nozzle 50 may be located so that when the nozzle arm 60 is at a stationary rotational location, liquid deposited on the substrate from the side nozzle 50 moves underneath the droplet nozzle 40, and the cleaning liquid (e.g., cleaning droplets 42) is sprayed at the portion of the substrate most recently sprayed by the wetting liquid 58.

As can be seen in FIGS. 1A and 1B, in one embodiment, the facing direction of the droplet nozzle 40 and direction of flow of the liquid exiting the droplet nozzle 40 is at an angle with respect to the facing direction of the side nozzle 50 and direction of flow of the liquid exiting the side nozzle 50. The droplet nozzle 40 may be referred to as a vertical nozzle, or a nozzle having a first angle with respect to the substrate 10 (here, for example, 90 degrees), and the side nozzle 50 may be referred to as an oblique nozzle, or a nozzle having a second angle with respect to the substrate 10 (here, for example, less than 90 degrees).

The side nozzle 50 may be separately disposed from a lateral side of the droplet nozzle 40 and have a slanted shape extending obliquely toward the surface 10s of the substrate 10. For example, the side nozzle 50 may have a shape extending obliquely at an angle A of about 30° to about 50° with respect to the surface 10s of the substrate 10. The side nozzle 50 may have a tip spaced apart from the droplet nozzle 40 at a distance D, for example, of about 5 mm to about 100 mm. The wetting liquid 58 may have a principal stream aimed obliquely toward the injection region 42i from the upstream side of the rotational direction Wrd of the substrate 10. For example, a center of the stream of the wetting liquid 58 may be aimed obliquely toward the injection region 42i.

Referring to FIG. 1C, in one embodiment, the nozzle arm 60 may have a central axis 60x passing through a center of the droplet nozzle 40, and the side nozzle 50 may have a central axis 50x inconsistent with the central axis 60x of the nozzle arm 60. For example, the side nozzle 50 may be located obliquely away from an edge of the substrate 10 such that an angle B of about 20° may be made between the central axis 50x of the side nozzle 50 and the central axis 60x of the nozzle arm 60. The droplet nozzle 40 may move along a half-scan locus S1 as described later with reference to FIG. 1F.

The substrate treatment apparatus 1 may have a structure optimized for cleaning the substrate 10 in a half-scan mode while the droplet nozzle 40 and the side nozzle 50 are moving along the half-scan locus S1. This will be described later in detail with reference to FIGS. 1F to 1H.

Figure 1D:
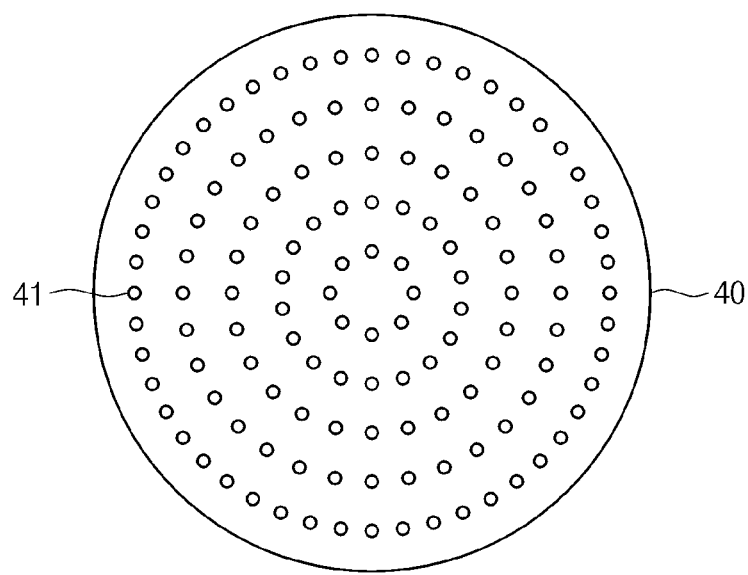
FIG. 1D is a plan view illustrating an arrangement of jetting holes in a substrate treatment apparatus according to exemplary embodiment of the present inventive concept.
Figure 1E:
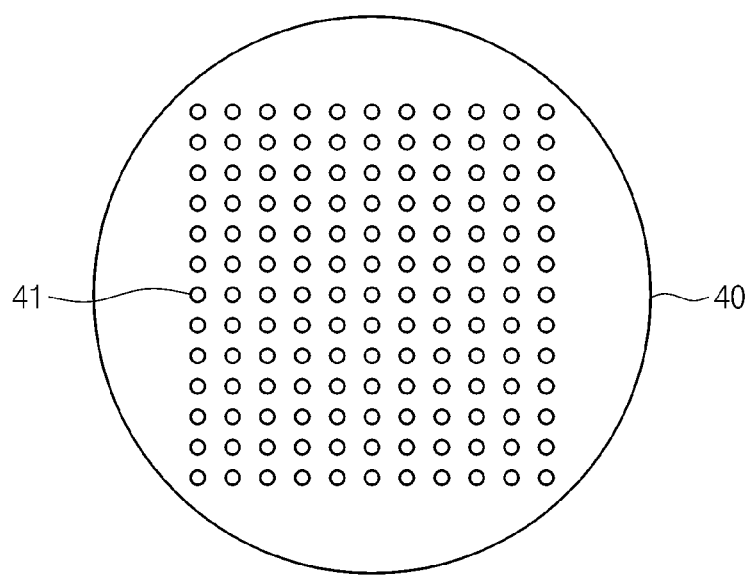
FIG. 1E is a plan view illustrating another arrangement of jetting holes in a substrate treatment apparatus according to exemplary embodiment of the present inventive concept.

FIG. 1D is a plan view illustrating an arrangement of jetting holes in a substrate treatment apparatus according to an exemplary embodiment. FIG. 1E is a plan view illustrating another arrangement of jetting holes in a substrate treatment apparatus according to another exemplary embodiment.

Referring to FIG. 1D, a plurality of jetting holes 41 each having a circular port may be radially arranged to form a plurality of circles or rings. Alternatively, as shown in FIG. 1E, the plurality of jetting holes 41 may be gridly distributed to form a mesh, or grid array.

The number of the jetting holes 41 may become greater as the size (or diameter) of the jetting hole 41 is smaller. For example, more than 80 jetting holes 41 each having a diameter of about 17 μm may be arranged. Alternatively, more than 140 jetting holes 41 each having a diameter of about 8 μm to about 12 μm may be arranged. In another embodiment, more than 300 jetting holes 41 each having a diameter of about 6 μm may be arranged. In yet another embodiment, more than 900 jetting holes 41 each having a diameter of about 4 μm may be arranged.

Figure 1F:
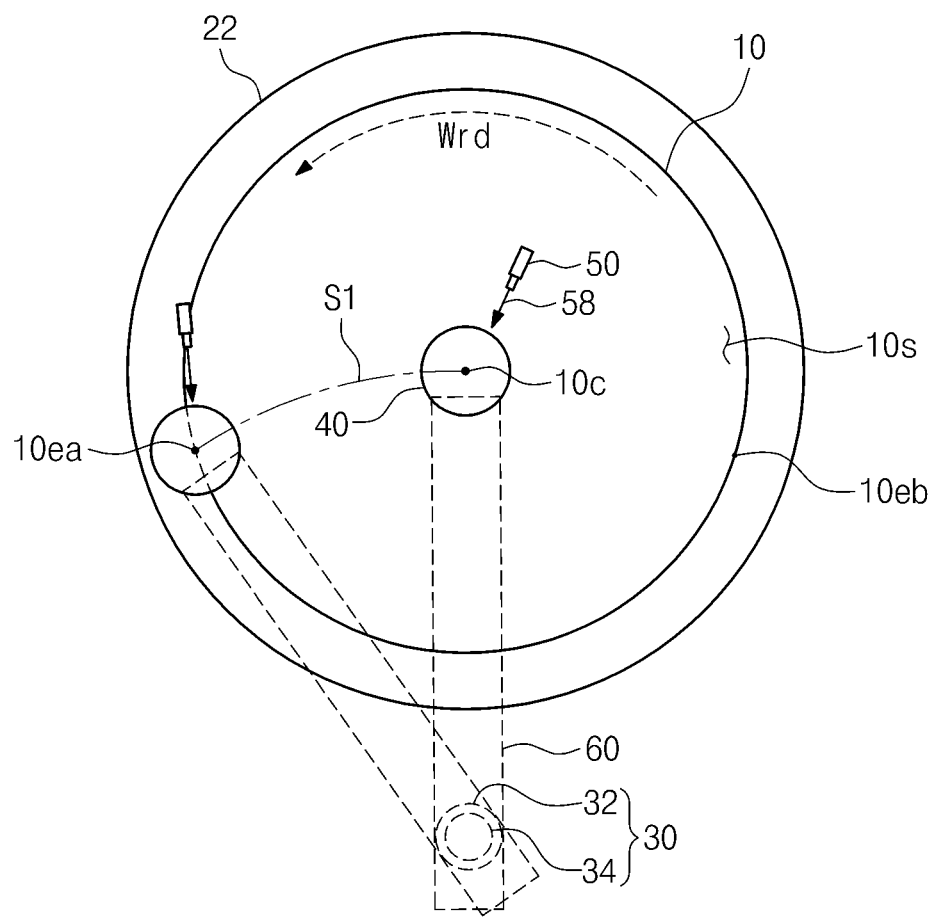
FIG. 1F is a plan view illustrating a method for treating a substrate using a substrate treatment apparatus of FIG. 1A according to an exemplary embodiment of the present inventive concept.
Figure 1G:
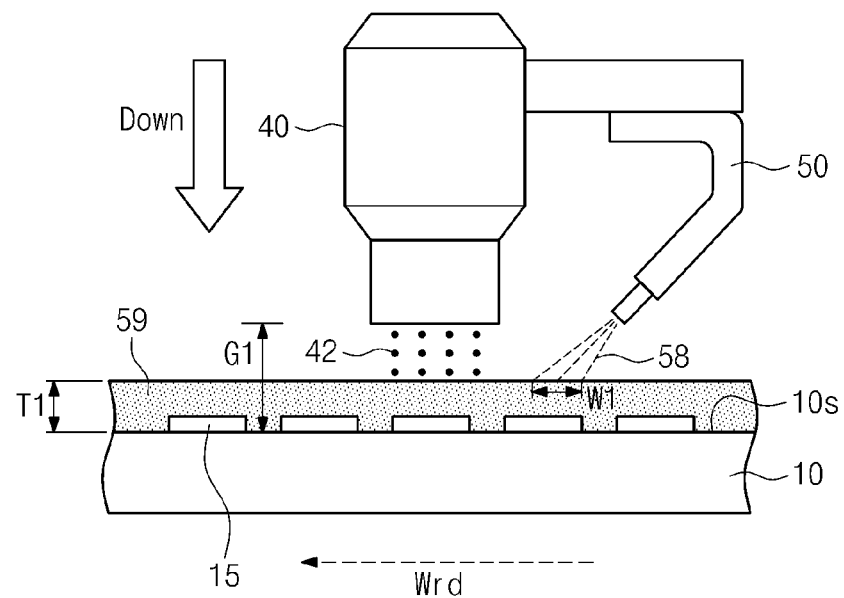
FIGS. 1G and 1H are cross sectional views illustrating a method for treating a substrate using a substrate treatment apparatus of FIG. 1A according to an exemplary embodiment of the present inventive concept.
Figure 1H:
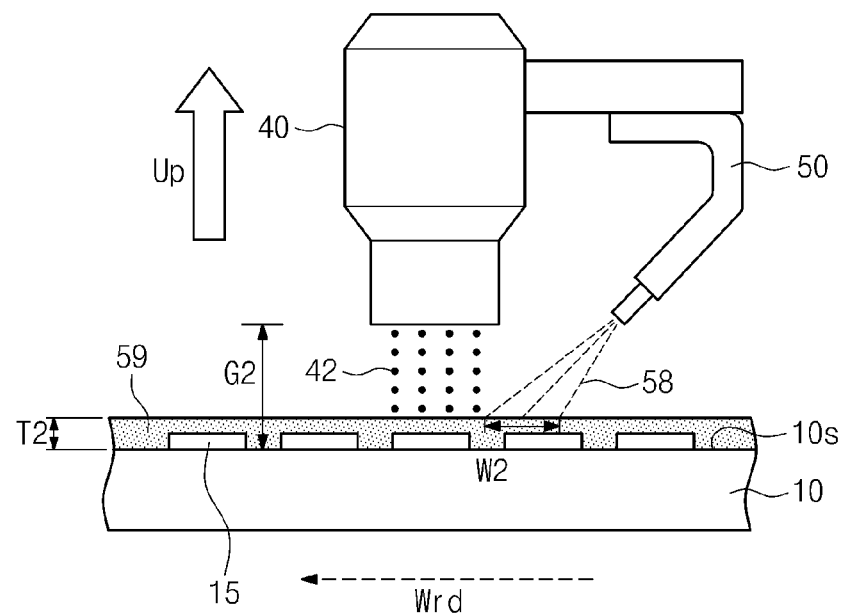

FIG. 1F is a plan view illustrating an exemplary method for treating a substrate using a substrate treatment apparatus of FIG. 1A. FIGS. 1G and 1H are cross sectional views illustrating an exemplary method for treating a substrate using a substrate treatment apparatus of FIG. 1A.

Referring to FIG. 1F, the rotating mechanism 32 may horizontally pivot the nozzle arm 60 parallel with the surface 10s of the substrate 10. Owing to a pivotal rotation of the nozzle arm 60, the droplet nozzle 40 may horizontally move on the surface 10s of the substrate 10, for example, along the half-scan locus S1. The side nozzle 50 may move together with the droplet nozzle 40 along the half-scan locus S1.

The half-scan locus S1 may be a path of the droplet nozzle 40 between a center 10c of the substrate 10 and one of a left edge 10ea and a right edge 10eb of the substrate 10. For example, the half-scan locus S1 may be an arcuate curve, also referred to herein as an arc, which extends between the left edge 10ea and the center 10c of the substrate 10. Alternatively, the half-scan locus S1 may be a straight line according to the driving mode of the rotating mechanism 32.

In a state that the droplet nozzle 40 is placed on the substrate 10 which is rotating on the spin chuck 22, the lift mechanism 34 may vertically drive the nozzle arm 60 such that droplet nozzle 40 may move away or toward the surface 10s of the substrate 10.

Owing to the driving of the lift mechanism 34, the droplet nozzle 40 may vertically move to get away from or near to the surface 10s of the substrate 10 and the side nozzle 50 may also vertically move together with the droplet nozzle 40. The droplet nozzle 40 and the side nozzle 50 may temporarily move up or down while horizontally moving along the half-scan locus S1.

In one embodiment, an injection quantity of the wetting liquid 58 sprayed from the side nozzle 50 may be substantially constant. As shown in FIGS. 1G and 1H, the side nozzle 50 may vertically move together with the droplet nozzle 40 such that an injection area of the wetting liquid 58 and a thickness of the wetting layer 59 may be substantially changed.

For example, as shown in FIG. 1G, if the droplet nozzle 40 moves downward and a first gap G1 is made between the droplet nozzle 40 and the surface 10s of the substrate 10, the wetting liquid 58 sprayed from the side nozzle 50 may have a first injection area W1 and the wetting layer 59 formed on the surface 10s of the substrate 10 may have a first thickness T1.

Alternatively, as shown in FIG. 1H, if the droplet nozzle 40 moves upward and a second gap G2 is made between the droplet nozzle 40 and the surface 10s of the substrate 10, the wetting liquid 58 sprayed from the side nozzle 50 may have a second injection area W2 and the wetting layer 59 formed on the surface 10s of the substrate 10 may have a second thickness T2. In some embodiments, the second gap G2 and the second injection area W2 may be greater than the first gap G1 and the first injection area W1, respectively, while the second thickness T2 may be less than the first thickness T1.

Based on the rotation of the wafer, at each horizontal location of the droplet nozzle 40 along the half-scan locus S1, the droplet nozzle 40 may inject the droplets 42 onto the substrate 10 having the surface 10s on which the wetting layer 59 is just previously formed, and the droplets 42 may collide with the wetting layer 59 and the crown formation may occur on a surface of the wetting layer 59. The crown formation may provide the wetting layer 59 with a pressure (or a shock wave) such that particles may be removed from the surface 10s of the substrate 10 and/or patterns 15 formed thereon, which may result in cleaning the substrate 10. The patterns 15 may include, for example, a conductive pattern such as certain conductive lines formed on the substrate.

The pressure applied to the wetting layer 59 may increase with the speed and/or size of the droplet 42. For example, the pressure may rise in proportion to the cube of droplet speed (or jetting velocity) and/or the square of droplet size. Therefore, the particle removal efficiency may be higher as the speed and/or size of the droplet 42 are greater.

The pressure applied to the wetting layer 59 may decrease with the thickness of the wetting layer 59. For example, the pressure may be inversely proportional to the square of the thickness of the wetting layer 59. Therefore, the particle removal efficiency may be higher as the thickness of the wetting layer 59 becomes smaller. In some embodiments, the particle removal efficiency may be improved when the wetting layer 59 has a smaller thickness, for example, the second thickness T2.

An effective or uniform cleaning treatment may be acquired to use the pressure of which value is changeable according to the thickness of the wetting layer 59. For example, as the droplet nozzle 40 horizontally moves along the half-scan locus S1 while injecting the droplets 42 onto the recently wetted substrate 10, the droplet nozzle 40, as well as the side nozzle 50 performing the wetting, may move upward on a specific zone where the particle removal is poor, for example, the center 10c or the left edge 10ea of the substrate 10. The side nozzle 50 may move upward together with the droplet nozzle 40 on the specific zone such that the wetting layer 59 having the second thickness T2 may be formed, which may result in increasing the pressure and improving the particle removal efficiency at the specific zone. As a result, the substrate 10 may be cleaned uniformly or effectively. In certain examples, the wetting layer 59 is described herein as a cleaning buffer wetting layer.

The surface 10s and/or the pattern 15 on a specific zone of the substrate 10 (e.g., at a particular radial distance from a center of the substrate) may be prone to damage owing to an extremely higher pressure. In this case, the droplet nozzle 40 may move downward and the side nozzle 50 may also move downward together therewith to form the wetting layer 59 having a greater thickness, for example, the first thickness T1. As such, as the wetting liquid and cleaning liquid are sprayed on the surface of the substrate 10, a first nozzle, such as a droplet nozzle 40 aimed in a first direction and angle with respect to the substrate (e.g., 90 degrees), and a second nozzle, such as a size nozzle 50 aimed in a second direction and angle with respect to the substrate (e.g., a different angle less than 90 degrees) may be displaced in a vertical direction up and down with respect to the substrate 10. As such, the two nozzles may be moved to a first vertical height above the substrate while simultaneously spraying liquids toward the substrate for treating (e.g., cleaning) a first portion or region of the substrate, and may be moved to a second vertical height above the substrate while continuing to simultaneously spray liquids toward the substrate for treating (e.g., cleaning) a second portion or region of the substrate. Though not shown, other embodiments may include the platform on which the wafer is disposed moving to a different vertical height rather than the two nozzles moving. Therefore, for certain portions or regions of the substrate 10, the pressure may be lowered and then damage to the surface 10s and/or the pattern 15 of the substrate 10 may be prevented or minimized.

Figure 2B:
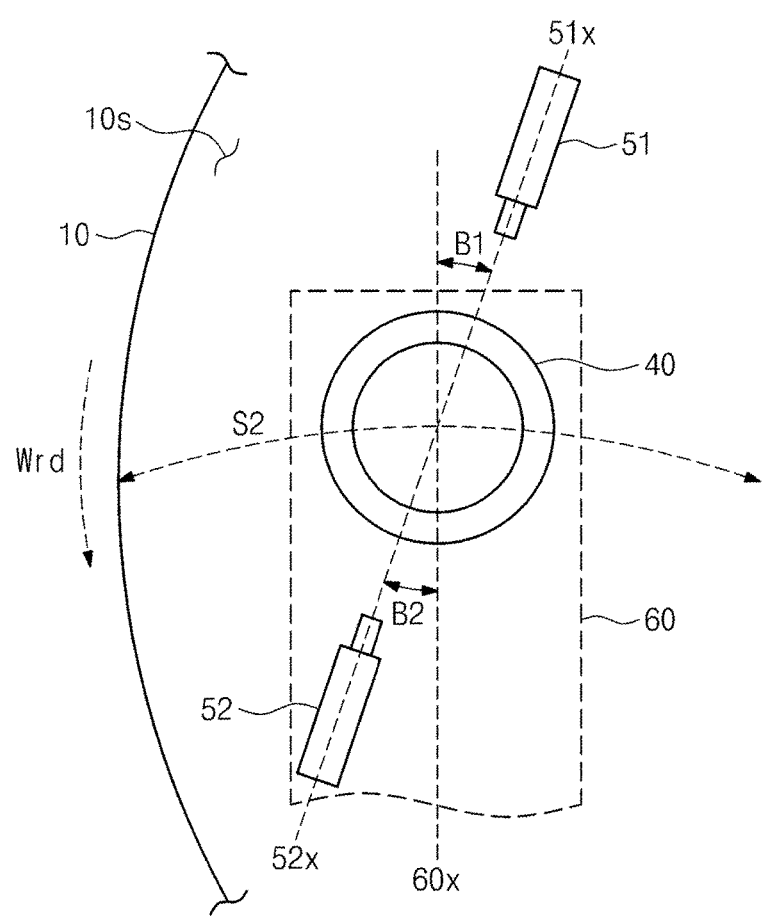
FIG. 2B is a plan view illustrating a portion of FIG. 2A according to an exemplary embodiment.

FIG. 2A is a schematic view illustrating a substrate treatment apparatus according to an exemplary embodiment. FIG. 2B is a plan view illustrating a portion of FIG. 2A. In the description of the embodiment that follows, the description of features that are the same as those of the substrate treatment apparatus 1 of FIG. 1A are omitted in order to avoid repetition.

Referring to FIG. 2A, a substrate treatment apparatus 2 may be configured to have a structure substantially identical or similar to that of the substrate treatment apparatus 1 of FIG. 1A. The droplet nozzle 40 may be installed on a bottom end of the nozzle arm 60. Alternatively, the droplet nozzle 40 may be settled on a lateral end of the nozzle arm 60 as illustrated in FIG. 1A. Differently from the substrate treatment apparatus 1, the substrate treatment apparatus 2 may include a twin side nozzle 51 and 52.

For example, the twin side nozzle 51 and 52 may include a first side nozzle 51 provided on one side of the droplet nozzle 40 and a second side nozzle 52 provided on another side of the droplet nozzle 40. The first and second side nozzles 51 and 52 may be located symmetrically with respect to the droplet nozzle 40. Alternatively, one of the first and second side nozzles 51 and 52 may be installed on the droplet nozzle 40 and the other may be settled on the nozzle arm 60.

Referring to FIG. 2B, the first and second side nozzles 51 and 52 may be respectively located upstream and downstream sides of the rotational direction Wrd of the substrate 10. For example, the first side nozzle 51 may be located obliquely away from an edge of the substrate 10 such that a first angle B1 of about 20° may be made between a central axes 51x of the first side nozzle 51 and the central axis 60x of the nozzle arm 60. The second side nozzle 52 may be located obliquely toward an edge of the substrate 10 such that a second angle B2 of about 20° may be made between a central axes 52x of the second side nozzle 52 and the central axis 60x of the nozzle arm 60.

Owing to a pivotal rotation of the nozzle arm 60, the first and second side nozzles 51 and 52 may move on the surface 10s of the substrate 10 along a full-scan locus S2 together with the droplet nozzle 40, as illustrated below with reference to FIG. 2C.

Figure 2C:
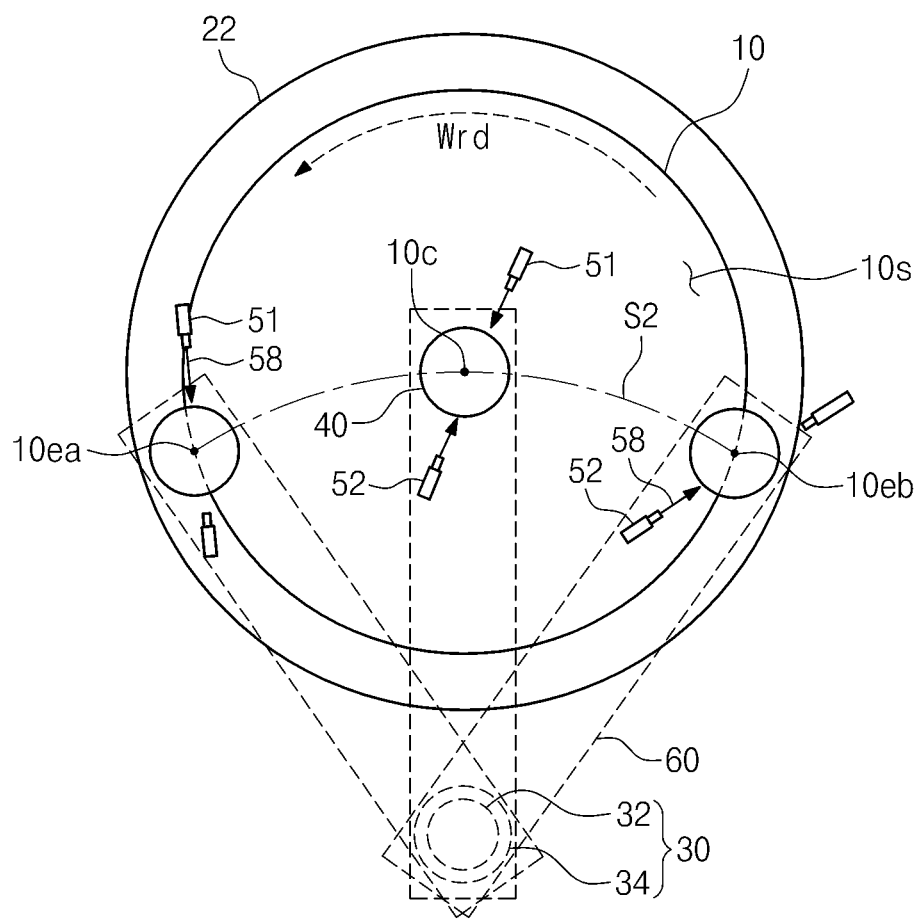
FIG. 2C is a plan view illustrating a method for treating a substrate using a substrate treatment apparatus of FIG. 2A according to an exemplary embodiment of the present inventive concept.

FIG. 2C is a plan view illustrating a method for treating a substrate using a substrate treatment apparatus of FIG. 2A according to an exemplary embodiment.

Referring to FIG. 2C, the rotating mechanism 32 may horizontally pivot the nozzle arm 60 parallel with the surface 10s of the substrate 10 along the full-scan locus S2. The full-scan locus S2 may be an arcuate curve or straight line which extends between the left edge 10ea and the right edge 10eb. The full-scan locus S2 may pass through the center 10c of the substrate 10.

When the droplet nozzle 40 moves between the left edge 10ea and the center 10c of the substrate 10, the first side nozzle 51 may inject the wetting liquid 58 onto the surface 10s of the substrate 10 in a direction toward the droplet nozzle 40. The wetting liquid 58 sprayed from the first size nozzle 51 may flow during the rotation in the rotational direction Wrd of the substrate 10 as the droplet nozzle 40 moves between the left edge 10ea and the center 10c of the substrate 10.

When the droplet nozzle 40 moves between the center 10c and the right edge 10eb of the substrate 10, the second side nozzle 52 may spray the wetting liquid 58 onto the surface 10s of the substrate 10 in a direction toward the droplet nozzle 40. The wetting liquid 58 sprayed from the second side nozzle 52 may flow during the rotation in the rotational direction Wrd of the substrate 10 as the droplet nozzle 40 moves between the center 10c and the right edge 10eb of the substrate 10.

The twin side nozzle 51 and 52 may inject the wetting liquid 58 of which flow direction during the rotation in the rotational direction Wrd of the substrate 10 even if the droplet nozzle 40 is placed on any point of the full-scan locus S2. For example, the twin side nozzle 51 and 52 may inject the wetting liquid 58 onto the substrate 10 without a conflict between the flow direction of the wetting liquid 58 and the rotational direction Wrd of the substrate 10. As such, the substrate treatment apparatus 2 may be adapted to treat the substrate 10 (e.g., cleaning treatment) in a full-scan mode.

The twin side nozzle 51 and 52 may move vertically upward together with the droplet nozzle 40 to form the wetting layer 59 having the second thickness T2 as illustrated in FIG. 1H, which may improve the particle removal efficiency. In contrast, the twin side nozzle 51 and 52 may move vertically downward together with the droplet nozzle 40 to form the wetting layer 59 having the first thickness T1 as illustrated in FIG. 1G, which may eliminate or reduce damages to the surface 10s and/or the pattern 15 of the substrate 10.

Figure 3A:
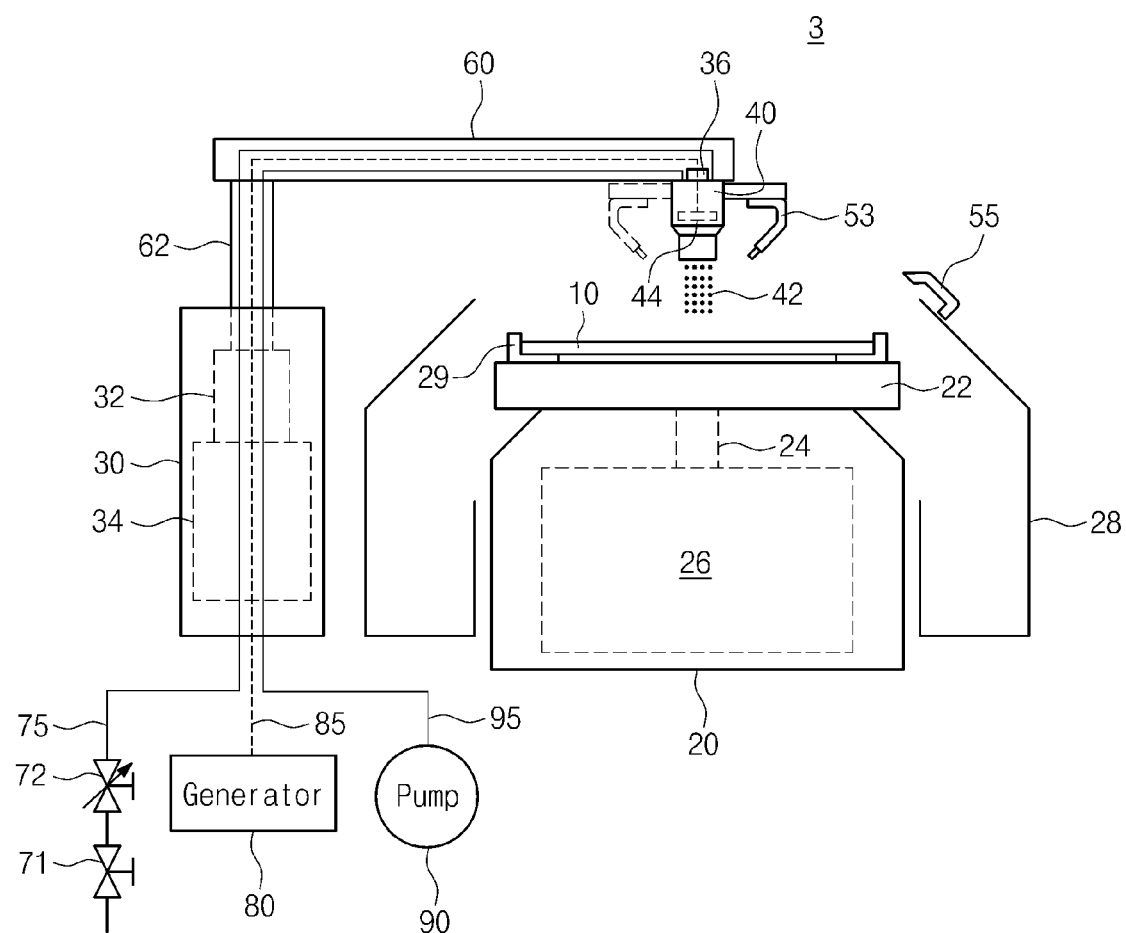
FIG. 3A is a schematic view illustrating a substrate treatment apparatus according to an exemplary embodiment of the present inventive concept.
Figure 3B:
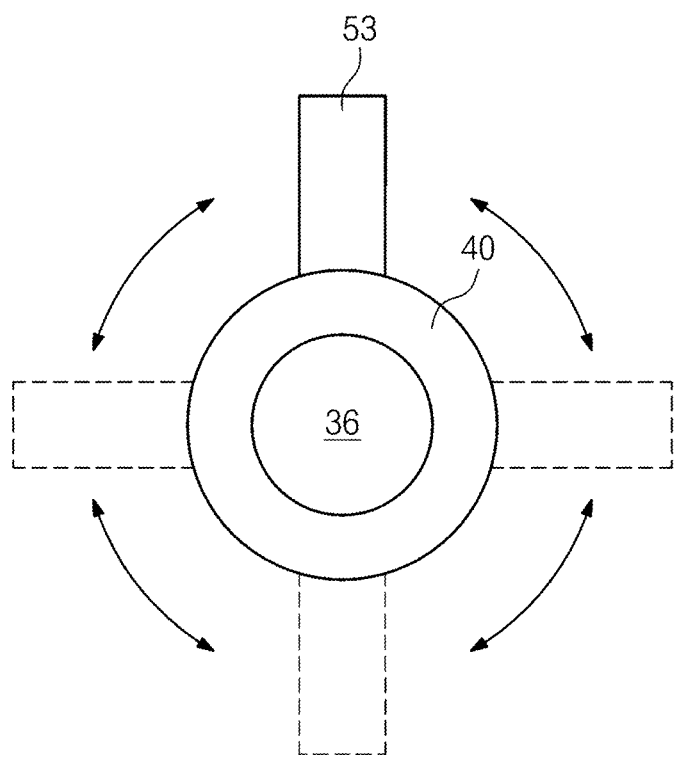
FIG. 3B is a plan view illustrating a portion of FIG. 3A according to an exemplary embodiment.

FIG. 3A is a schematic view illustrating a substrate treatment apparatus according to an exemplary embodiment. FIG. 3B is a plan view illustrating a portion of FIG. 3A. In the description of the embodiment that follows, the description of features that are the same as those of the substrate treatment apparatus 1 of FIG. 1A are omitted in order to avoid repetition.

Referring to FIG. 3A, a substrate treatment apparatus 3 may be configured to have a structure substantially identical or similar to that of the substrate treatment apparatus 1 of FIG. 1A. The droplet nozzle 40 may be installed on a bottom or side end of the nozzle arm 60. Differently from the substrate treatment apparatus 1, the substrate treatment apparatus 3 may include a movable side nozzle 53. The movable side nozzle 53 may be designed to revolutionarily rotate around the droplet nozzle 40 by receiving a driving force from a motor 36. The motor 36 may be provided inside or outside of the nozzle arm 60. The movable side nozzle 53 may move vertically and horizontally together with the droplet nozzle 40 based on a movement of the nozzle arm 60, but may additionally move rotationally around the droplet nozzle 40.

Referring to FIG. 3B, the motor 36 may drive the movable side nozzle 53 along a side of the droplet nozzle 40. For example, the movable side nozzle 53 may revolve at a particular angle, for example, about 360° or about 180°, along at least one of leftward and rightward directions.

Since the movable side nozzle 53 can revolve around the droplet nozzle 40, it may be possible to serve as the twin side nozzle 51 and 52 of FIG. 2A. For example, when the droplet nozzle 40 equipped with the movable side nozzle 53 moves along the full-scan locus S2 between the left edge 10*ea* and the center 10*c* of the substrate 10, the movable side nozzle 53 may revolve to have a position corresponding to that of the first side nozzle 51. When the droplet nozzle 40 moves along the full-scan locus S2 between the center 10*c* and the right edge 10*eb* of the substrate 10, the movable side nozzle 53 may revolve to have a position corresponding to that of the second side nozzle 52. As such, the substrate treatment apparatus 3 including the movable side nozzle 53 may be adapted to treat the substrate 10 (e.g., cleaning treatment) in both the full-scan mode and the half-scan mode.

The movable side nozzle 53 may move vertically upward together with the droplet nozzle 40 to form the wetting layer 59 having the second thickness T2 as illustrated in FIG. 1H, which may result in improving the particle removal efficiency. In contrast, the movable side nozzle 53 may move vertically downward together with the droplet nozzle 40 to form the wetting layer 59 having the first thickness T1 as illustrated in FIG. 1G, which may result in eliminating or reducing damages to the surface 10*s* and/or the pattern 15 of the substrate 10.

According to embodiments of the present invention, the side nozzle injects wetting liquid while moving up and down together with the droplet nozzle such that thickness of the wetting layer changes. Therefore, droplet-generated pressure applied to the wetting layer becomes higher to improve the particle removal efficient, or becomes lower to eliminate or reduce damages to the surface and/or patterns of the substrate.

Figure 4:
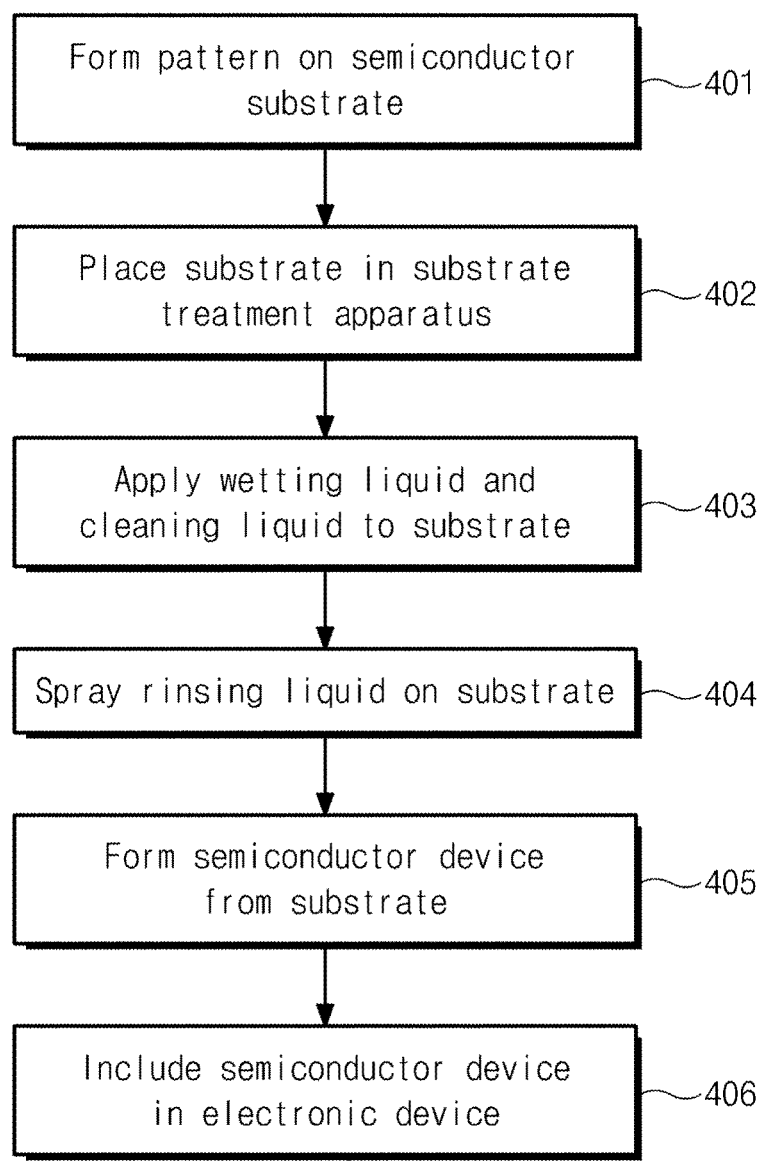
FIG. 4 is a flow chart illustrating a method of manufacturing a semiconductor device according to an exemplary embodiment.

FIG. 4 is a flow chart illustrating a method of manufacturing a semiconductor device according to an exemplary embodiment.

In step 401, a pattern is formed on a semiconductor substrate such as a wafer. For example, a pattern such as pattern 15 (FIG. 1G) may be formed on a substrate such as substrate 10. The pattern may be formed on a surface of the substrate, and may include, as one example, a conductive pattern forming conductive lines.

In step 402, the semiconductor wafer is placed in a substrate treatment apparatus, such as one of apparatuses 1, 2, or 3 described above. For example, the semiconductor wafer may be placed on a platform such as a spin chuck 22 connected to a spin unit 20 of a substrate treatment apparatus that includes the various components described above in connection with FIGS. 1A-3B.

In step 403, a wetting liquid and cleaning liquid are applied to (e.g., sprayed onto) the substrate, for example, in one of the various manners described above. For example, at a first period of time, when the nozzle arm 60 causes a first nozzle (e.g., droplet nozzle 40, also referred to as a cleaning nozzle) to be at a particular radial distance from a center of the wafer both a wetting liquid and a cleaning liquid may be applied to the wafer as the wafer rotates. As such, the wetting liquid may be deposited on a particular point on the wafer immediately before the cleaning liquid is sprayed at that point, to serve as a buffer for the cleaning droplets. In one embodiment, the wetting liquid is deposited using a second nozzle (e.g., side nozzle 50, also referred to as a wetting nozzle), that moves vertically together with the first nozzle. The first and second nozzles may move vertically up and down together, for example, based on an up and down movement of the nozzle arm 60.

Continuing with step 403, as the nozzle arm 60 causes the first nozzle to move to different distances from the center of the wafer, the first nozzle and second nozzle may move up or down vertically together, in order to cause a different thickness of wetting liquid to serve as a buffer for the cleaning droplets. Therefore, for a first region of the wafer (e.g., radial distance from the center of the wafer), the first nozzle and second nozzle may spray their respective liquids from first and second respective vertical heights with respect to a platform on which the wafer is disposed. Then, for a second region of the wafer, the first nozzle and second nozzle may be displaced the same vertical distance together, either up or down, with respect to the platform, to spray their respective liquids from third and fourth respective vertical heights respective to the platform. The distance between the first and third heights may be the same as the distance between the second and fourth heights. The heights may be controlled, for example, by vertically raising or lowering the nozzle arm 60, which causes the height of each of the first nozzle and the second nozzle to change with respect to the platform.

As a result of the above step, different regions of the substrate may use different thicknesses of wetting liquid and therefore employ higher or lower cleaning pressure on the surface of the substrate, without the need to vary the speed or amount of spray exiting the second (e.g., wetting) nozzle. Instead, the different thicknesses can be controlled by raising or lowering the wetting nozzle with respect to the substrate and keeping the flow of wetting liquid from the wetting nozzle constant.

In step 404, a rinsing liquid may be sprayed onto the substrate, and/or a centrifugal rotation may occur, to remove any remaining liquid and particles from the substrate.

In step 405, one or more additional processes may be performed on the substrate to form one or more semiconductor devices such as semiconductor chips. For example, additional layers and/or patterns may be added to the substrate to form integrated circuits thereon. The chips may be, for example memory chips or logic chips, or combinations thereof. The chips may be singulated from each other to form individual semiconductor devices.

In step 406, each semiconductor chip may be included in an electronic device. For example, a singulated semiconductor chip may be mounted on a package substrate and covered with protective mold to form a semiconductor device such as semiconductor package, or a package-on-package device. A singulated semiconductor chip may alternatively be mounted on a board such as a printed circuit board (PCB) to be included in a module, such as a memory module. As such, the semiconductor chip may be included in an electronic device (e.g., a package or module), which may in turn form a larger electronic device, such as a computer, cellular phone, tablet device, digital camera, or other personal electronic device.

Although the present disclosure has been described in connection with various embodiments illustrated in the accompanying drawings, the invention is not limited thereto. It will be apparent to those skilled in the art that various substitutions, modifications, and changes may be made thereto without departing from the scope and spirit of the invention as defined in the following claims.

What is claimed is:

1. A method of manufacturing a semiconductor device, the method comprising:
    forming a pattern on a surface of a semiconductor substrate;
    placing the substrate on a platform of a substrate treatment apparatus;
    rotating the substrate while providing a cleaning liquid on the substrate using a first nozzle and a wetting liquid on the substrate using a second nozzle to treat a first region on the surface of the substrate;
    vertically changing the distance of the second nozzle together with the first nozzle with respect to the platform;
    after the vertical change, rotating the substrate while providing the cleaning liquid on the substrate using the first nozzle and the wetting liquid on the substrate using the second nozzle to treat a second region on the surface of the substrate;
    forming a semiconductor device from the treated substrate;
    for the first region, providing a relatively thicker amount of wetting liquid to the surface of the substrate, and then providing the cleaning liquid to the relatively thicker amount of wetting liquid; and
    for the second region, providing a relatively thinner amount of wetting liquid to the surface of the substrate, and then providing the cleaning liquid to the relatively thinner amount of wetting liquid.

2. The method of claim 1, wherein vertically changing the distance is performed by vertically moving a nozzle arm connected to the first and second nozzles.

3. The method of claim 1, wherein providing the cleaning liquid on the substrate using the first nozzle includes spraying the cleaning liquid toward the surface of the substrate at an angle with respect to the substrate of about 90 degrees, and applying the wetting liquid on the substrate using the second nozzle includes spraying the wetting liquid toward the surface of the substrate at an angle with respect to the substrate of less than 90 degrees.

4. The method of claim 1, wherein as a result of the rotating, the wetting liquid provided to the substrate is applied upstream from the cleaning liquid provided to the substrate.

5. The method of claim 1, wherein treating the second region includes:
    moving a nozzle arm horizontally with respect to the substrate to move at least the first nozzle in a radial direction with respect to the substrate.

6. The method of claim 1, further comprising:
    applying the cleaning liquid at a flow quantity of less than about ⅒ the flow quantity of applying the wetting liquid.

7. The method of claim 6, further comprising:
    providing the wetting liquid at a flow quantity of about 0.5 l/min to about 2 l/min; and
    providing the cleaning liquid at a flow quantity of about 20 cc/min to about 50 cc/min.

8. The method of claim 1, wherein the substrate is a wafer, and further comprising:
    forming the semiconductor device by singulating a piece of the wafer to form a semiconductor chip.

9. The method of claim 8, further comprising:
    forming the semiconductor device by placing the semiconductor chip on a package substrate and covering the semiconductor chip by a protective mold to form a semiconductor package.

10. A method of manufacturing a semiconductor device, the method comprising:
    forming a pattern on a surface of a semiconductor substrate;
    placing the substrate on a platform of a substrate treatment apparatus;
    rotating the substrate while applying a cleaning liquid from a first nozzle to a wetting liquid from a second nozzle to treat a first region on the surface of the substrate;
    vertically moving the second nozzle with respect to the substrate;
    after the vertical movement, rotating the substrate while applying the cleaning liquid from the first nozzle to the wetting liquid from the second nozzle to treat a second region on the surface of the substrate;
    forming a semiconductor device from the treated substrate;
    for the first region, applying a relatively thicker amount of wetting liquid to the surface of the substrate, and then applying the cleaning liquid on the relatively thicker amount of wetting liquid; and
    for the second region, after vertically moving the second nozzle, applying a relatively thinner amount of wetting liquid to the surface of the substrate, and then applying the cleaning liquid on the relatively thinner amount of wetting liquid.

11. The method of claim 10, wherein, a pressure applied by the cleaning liquid is greater when the cleaning liquid is applied on the relatively thinner amount of wetting liquid than when the cleaning liquid is applied on the relatively thicker amount of wetting liquid.

12. The method of claim 10, wherein the step of vertically moving the second nozzle includes:
    vertically moving the second nozzle together with the first nozzle with respect to the platform.

13. The method of claim 10, further comprising:
    applying the cleaning liquid at a flow quantity of less than about ⅒ the flow quantity of applying the wetting liquid.

14. A method comprising:
    placing a substrate having a pattern formed thereon on a platform of a substrate treatment apparatus;
    providing a wetting liquid on the substrate using a side nozzle so as to form a wetting layer on the substrate; and treating the substrate by providing droplets of a treatment liquid on the substrate using a droplet nozzle so as to give the wetting layer a pressure generating from collisions between the droplets and a surface of the wetting layer;

wherein the forming of the wetting layer comprises:
vertically moving the side nozzle together with the droplet nozzle on the substrate; and
providing the wetting liquid on the substrate using the side nozzle, wherein the wetting layer has a thickness of which value is varied depending on the vertical movement of the side nozzle, and wherein the pressure has a value changeable depending on a variation of the thickness of the wetting layer.

15. The method of claim 14, wherein the forming of the wetting layer comprises at least one of:
moving the side nozzle together with the droplet nozzle toward a surface of the substrate to form a first wetting layer having a first thickness on the surface of the substrate; and
moving the side nozzle together with the droplet nozzle away from the surface of the substrate to form a second wetting layer on the surface of the substrate, the second thickness being less than the first thickness.

16. The method of claim 15, wherein the providing of the droplets comprises at least one of:
colliding the droplets with a surface of the first wetting layer to provide the first wetting layer with a first pressure; and
colliding the droplets with a surface of the second wetting layer to provide the second wetting layer with a second pressure greater than the first pressure.

17. The method of claim 14, wherein the forming of the wetting layer further comprises:
rotating the substrate around a central axis thereof;
horizontally moving the droplet nozzle on a surface of the substrate along a locus extending at least between an edge and a center of the substrate; and
horizontally moving the side nozzle together with the droplet nozzle on the surface of the substrate along the locus.

18. The method of claim 14, wherein the forming of the wetting layer further comprises rotating the substrate around a central axis thereof,
wherein the side nozzle provides the wetting liquid on the surface of the substrate, the wetting liquid being injected to an upstream side of a rotational direction of the substrate, and the droplet nozzle provides the droplets on the wetting liquid, the droplets being injected to a downstream side of the rotational direction of the substrate.

* * * * *